United States Patent
Kato (10) Patent No.: US 7,649,229 B2
(45) Date of Patent: Jan. 19, 2010

(54) ESD PROTECTION DEVICE

(75) Inventor: Katsuhiro Kato, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 292 days.

(21) Appl. No.: 11/730,081

(22) Filed: Mar. 29, 2007

(65) Prior Publication Data

US 2007/0230074 A1 Oct. 4, 2007

(30) Foreign Application Priority Data

Mar. 31, 2006 (JP) .............................. 2006-098235

(51) Int. Cl.
*H01L 23/60* (2006.01)
(52) U.S. Cl. .................. 257/360; 257/355; 257/363; 257/E29.176; 361/56; 361/91.5
(58) Field of Classification Search ................ 257/341, 257/360, 328, 355, 358, 363, 364, E29.176; 361/56, 91.5
See application file for complete search history.

(56) References Cited

U.S. PATENT DOCUMENTS

| | | | |
|---|---|---|---|
| 5,486,716 A * | 1/1996 | Saito et al. ................. | 257/360 |
| 5,793,084 A | 8/1998 | Choi et al. | |
| 6,441,438 B1 * | 8/2002 | Shih et al. ................... | 257/355 |
| 6,501,155 B2 * | 12/2002 | Okawa ........................ | 257/652 |
| 7,579,658 B2 * | 8/2009 | Ker et al. .................... | 257/356 |
| 2002/0123222 A1 * | 9/2002 | Wu ............................. | 438/682 |

FOREIGN PATENT DOCUMENTS

JP 06-005871 1/1994

* cited by examiner

Primary Examiner—Jerome Jackson, Jr.
Assistant Examiner—Yu Chen
(74) Attorney, Agent, or Firm—Volentine & Whitt, P.L.L.C.

(57) ABSTRACT

A semiconductor device capable of preventing an electrostatic surge without increasing a leak current. In the semiconductor device, a protection circuit for protecting an internal circuit is provided between a source line and a ground line. The protection circuit has a protection transistor of which the drain is connected to the source line and the source and gate are connected to the ground line. The protection transistor is configured by integrally forming two types of transistor structural portions. The latter of the transistor structural portions is longer than the former thereof in gate length. In addition, the sum of gate widths of the latter transistor structural portions is larger than the sum of gate widths of the former transistor structural portions.

10 Claims, 12 Drawing Sheets

PRIOR ART

ESD PROTECTION DEVICE

BACKGROUND OF THE INVENTION

The present invention relates to a semiconductor device equipped with a protection circuit for protecting an integrated circuit block from a electrostatic discharge (ESD).

With the recent widespread use or the like of mobile devices, there has been an increasingly growing demand for a reduction in power consumption with respect to a semiconductor device. This is because the mobile devices use a rechargeable built-in battery or a dry battery or the like as a drive source or power supply. Suppressing charging and the required frequency of replacement of the dry battery low (i.e., prolonging battery life) becomes an important factor to enhance the commercial value of the mobile device.

As one factor for increasing power consumption of the semiconductor device, there exists a leak current flowing through each of transistors or diodes that constitutes an integrated circuit. The leak current is of a current that flows when the transistor or diode is in an off state or a reverse-biased state. It is desirable that in order to suppress the power consumption, each of the elements lying in the integrated circuit is so designed that the leak current is kept as small as possible.

As one method for reducing the leak current, there is known a method for suppressing a source voltage low. In a technique described in, for example, a patent document 1 (Japanese Unexamined Patent Publication No. Hei 6(1994)-5871), depressions and projections are formed in side faces of a floating gate to allow electric charges to concentrate, thus making it possible to reduce a write voltage/erase voltage of a nonvolatile memory, whereby power consumption of a memory device can be suppressed. Since, however, the number of elements of the semiconductor device is numerous, a leak current becomes a large value as the entire integrated circuit even though the value per element is negligible. Even though a leak current per element is a trillionth $(1 \times 10^{-12})$ ampere where, for example, the number of elements in the integrated circuit is a million $(1 \times 10^6)$, the sum of leak currents reaches a millionth $(1 \times 10^{-6})$ ampere. There is also a possibility that this leak current value will be inneglibible depending upon the specs of the mobile device and will bring no commercial value. Thus, it is not possible to keep the leaks current small sufficiently where the source voltage is simply reduced.

On the other hand, there has been known a technique for dividing an integrated circuit into a plurality of blocks and supplying a source voltage to the driven block alone, thereby reducing a leak current. According to the technique, no leak current is generated because the undriven blocks are not supplied with the source voltage. Thus, the leak current at the entire semiconductor device can greatly be reduced.

Here, the integrated circuit includes, in many cases, the blocks which may be driven only upon the use of their corresponding functions, and the block which needs to be always driven. When the constantly driven block is contained therein, a reduction in the circuit scale of the constantly driven block where practicable is also effective in reducing power consumption.

However, a new drawback arises in that when a small-scale integrated circuit block is constituted of elements small in leak current, it becomes easy to cause an ESD damage of each element.

As the technology of preventing a transistor's ESD damage, there has been known a technique described in, for example, a patent document 2 (Japanese Unexamined Patent Publication No. Hei 9 (1997)-260504). In the technique disclosed in the patent document 2, the gate length of both end of every transistors are made longer than the gate length of its central portion to prevent electric field concentration, thereby preventing the ESD damage. However, the present technique is insufficient as the technique of preventing the ESD damage of the integrated circuit because a surge current per se cannot be reduced.

Figure 12:
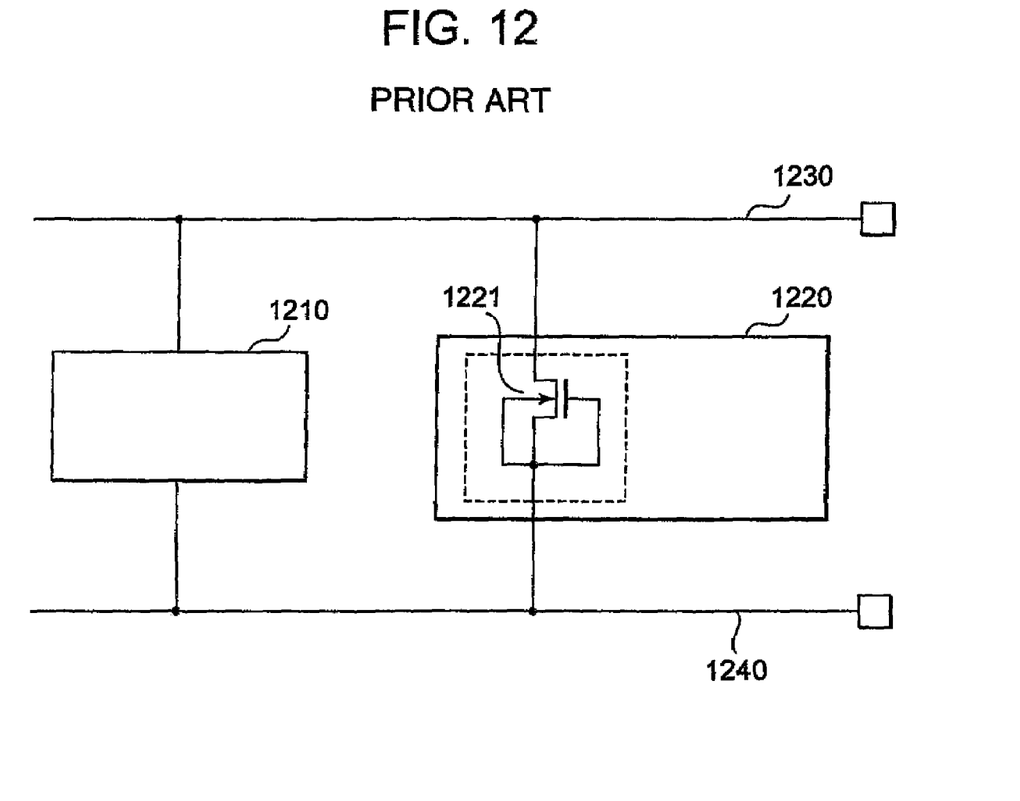
FIG. 12 is a block diagram illustrating an example of an essential configuration of a prior art semiconductor device.

In contrast to this, there has been proposed a method of providing a protection circuit to prevent an ESD damage of each element that constitutes an integrated circuit block. FIG. 12 is a circuit diagram schematically showing a configuration of an integrated circuit having a protection circuit. As shown in FIG. 12, an internal circuit (e.g., the above constantly driven circuit) 1210 and a protection circuit 1220 are connected in parallel between a source line 1230 and a ground line 1240. While a MOS (Metal Oxide Semiconductor) transistor or a PN junction diode can be used as the protection circuit 1220, a GGNMOS (Gate Grounded NMOS) 1221 is used in the example of FIG. 12. Providing the protection circuit 1220 makes it possible to prevent an electrostatic surge.

However, a drawback arises in that when the protection circuit 1220 is provided, leak currents of elements constituting the protection circuit 1220 are generated, thereby increasing a leak current of the integrated circuit. When, for example, the protection circuit 1220 is constituted of the MOS transistor, a subthreshold current becomes a leak current. When the protection circuit 1220 is constituted of the PN junction diode, a junction leak current becomes a leak current. On the other hand, when the protection circuit 1220 is so designed that the leak current is reduced, the effect of preventing the electrostatic surge is impaired.

SUMMARY OF THE INVENTION

An object of the present invention is to provide a semiconductor device capable of preventing an electrostatic surge without increasing a leak current.

According to one aspect of the present invention, for attaining the above object, there is provided a semiconductor device which comprises an internal circuit connected to first and second source lines and a protection circuit connected to the first and second source lines to protect the internal circuit.

The protection circuit has a protection transistor which includes first high-concentration impurity regions each connected to the first source line, second high-concentration impurity regions each connected to the second source line, and control electrodes which have first control electrodes each having a first gate length and second control electrodes each having a second gate length longer than the first gate length, both of the first and second control electrodes being formed integrally, and which are connected to the second source line. The protection transistor includes first transistor structural portions each having the first high-concentration impurity region, the second high-concentration impurity region and the first control electrode, and second transistor structural portions each having the first high-concentration impurity region, the second high-concentration impurity region and the second control electrode.

According to the present invention, a first transistor structural portion short in gate length can ensure a response of a protection circuit to an electrostatic surge, and a second transistor structural portion long in gate length can suppress an increase in leak current.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. Incidentally, the size, shape and physical relationship of each constituent element in the figures are merely approximate illustrations to enable an understanding of the present invention, and further the numerical conditions explained below are nothing more than mere examples.

First Preferred Embodiment

A semiconductor device according to a first embodiment of the present invention will first be explained using FIGS. 1 through 4.

Figure 1:
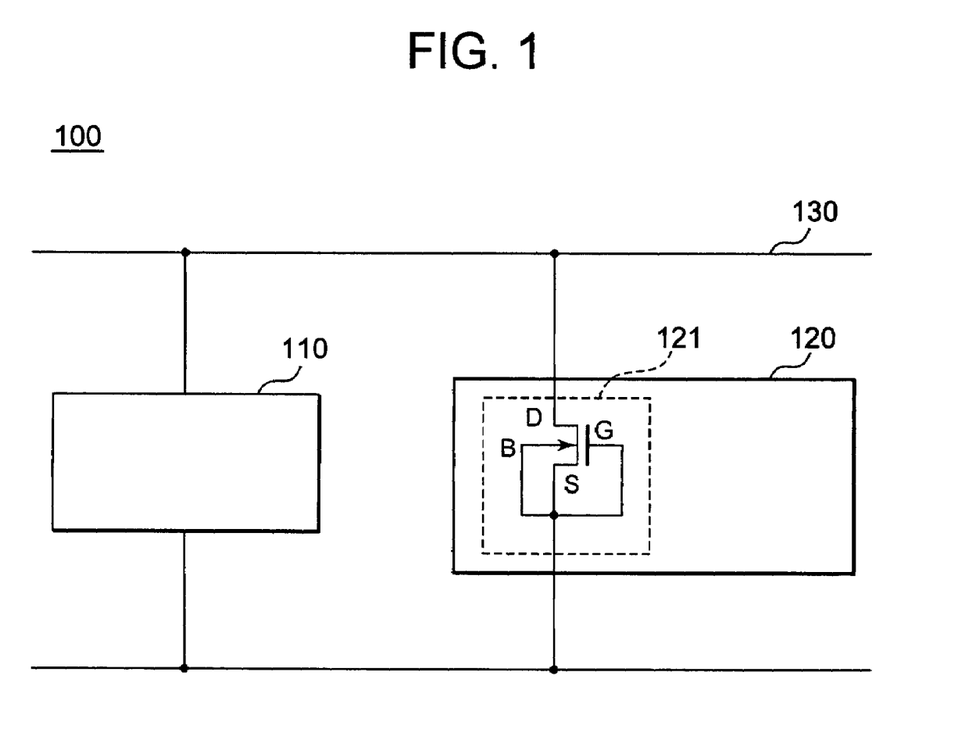
FIG. 1 is a circuit block diagram showing an essential configuration of a semiconductor device according to a first embodiment.

FIG. 1 is a circuit block diagram showing an essential configuration of the semiconductor device according to the present embodiment. FIG. 2 is a plan view conceptually showing a layout structure of a circuit block shown in FIG. 1.

As shown in FIG. 1, the semiconductor device 100 according to the present embodiment has an internal circuit 110, a protection circuit 120, a source line 130 and a ground line 140.

Figure 2A:
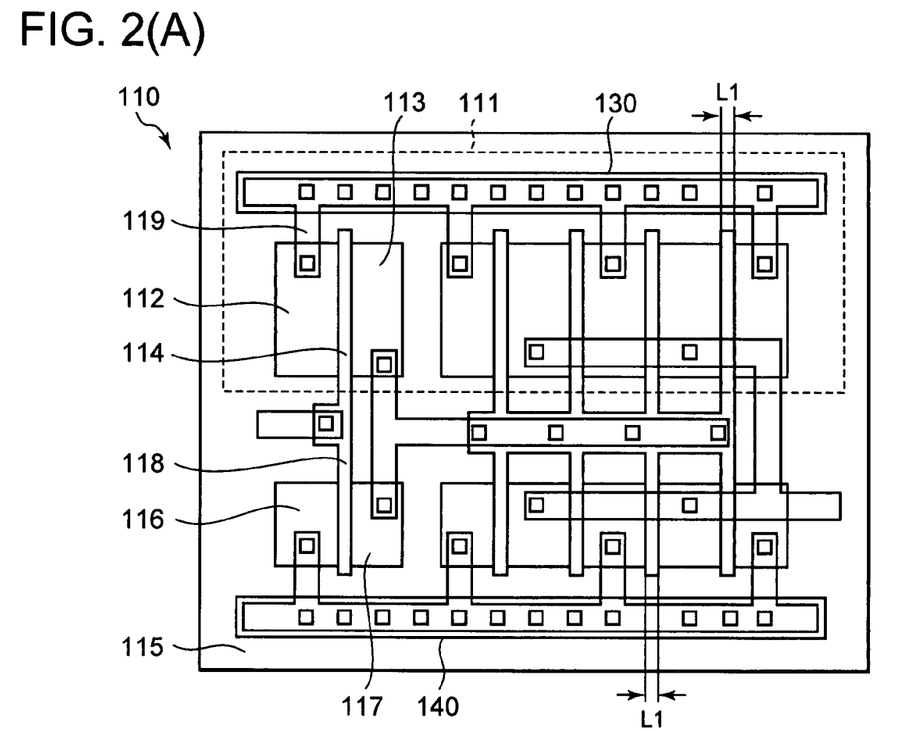
FIG. 2 is a plan view conceptually showing a layout structure of the semiconductor device according to the first embodiment.

In FIG. 1, the internal circuit 110 is of an integrated circuit for implementing some functions of the semiconductor device 100, for example, the above constantly driven circuit. The internal circuit 110 is connected to the source line 130 and the ground line 140. FIG. 2(A) is a plan view schematically showing a layout configuration example of the internal circuit 110. As shown in FIG. 2(A), a plurality of PMOS transistors each including a P type source region 112, a P type drain region 113 and a gate electrode 114 are formed in an N type region 111. A plurality of NMOS transistors each including an N type source region 116, an N type drain region 117 and a gate electrode 118 are formed in a P type region 115. The source regions 112 and 116, the drain regions 113 and 117 and the gate electrodes 114 and 118 are respectively wired by wiring patterns 119. In the present embodiment, the wiring widths (i.e., gate lengths of PMOS and NMOS transistors) of the gate electrodes 114 and 118 are all the same value L1.

Figure 2B:
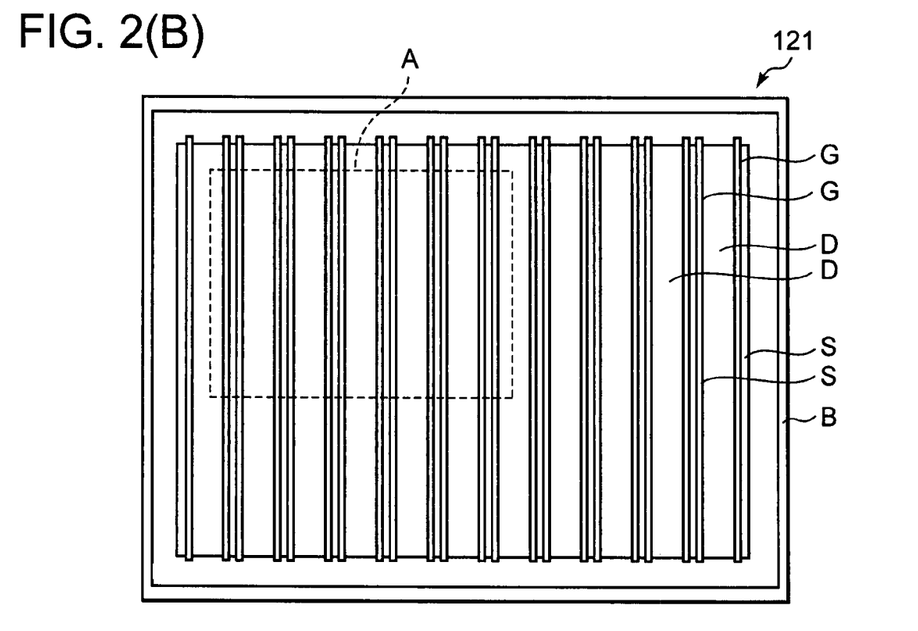
Figure 3:
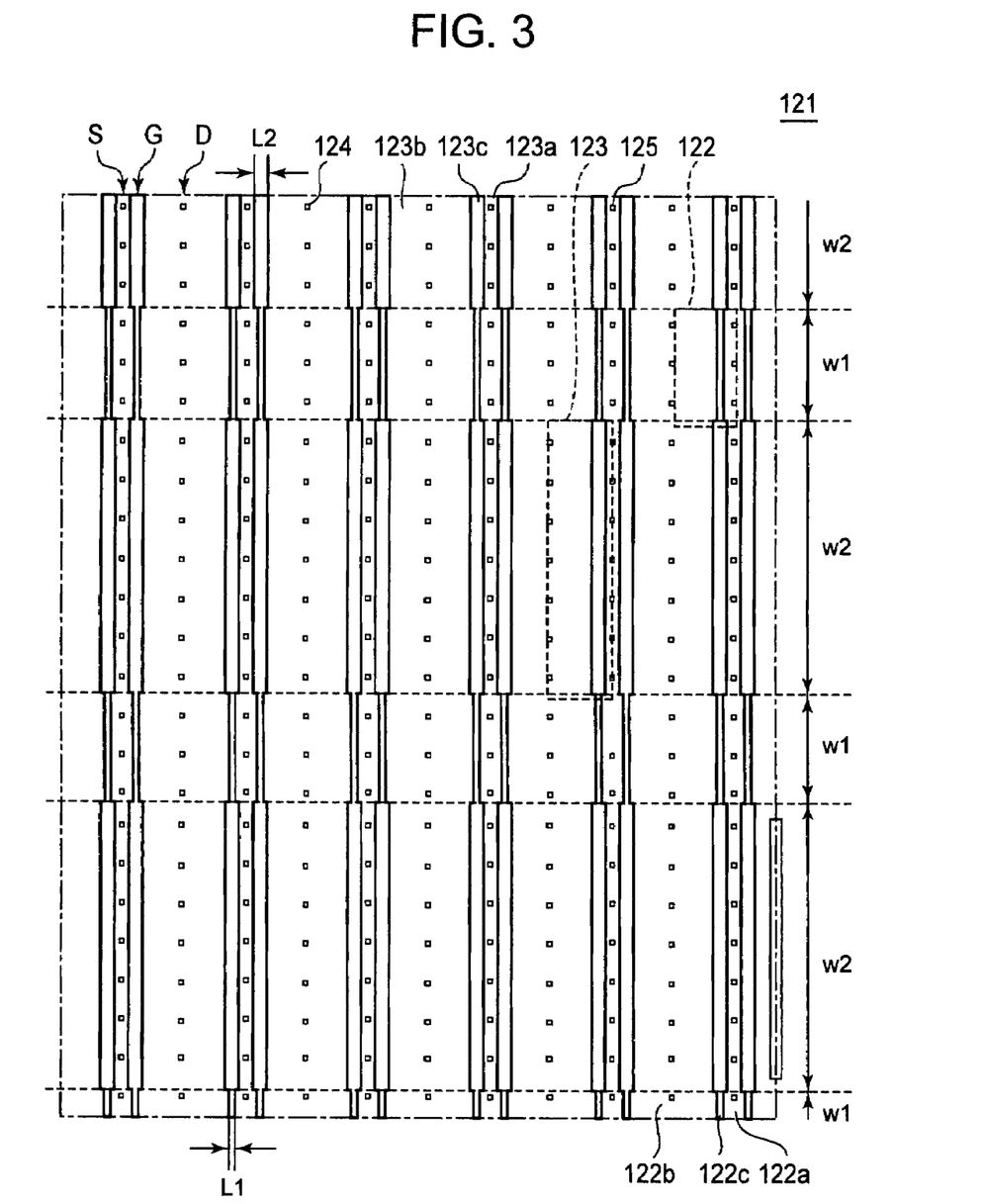
FIG. 3 is a plan view showing, in enlarged form, the layout structure of the semiconductor device according to the first embodiment.

In FIG. 1, the protection circuit 120 is an integrated circuit for protecting the integrated circuit block from a surge current. As shown in FIG. 1, the protection circuit 120 has one protection transistor 121. The protection transistor 121 is of an NMOS structure. The protection transistor 121 is connected to the source line 130 at the drain D thereof and connected to the ground line 140 at the source S and gate G thereof. A substrate potential B is applied to the protection transistor 121. FIG. 2(B) is a plan view conceptually showing a layout configuration example of the protection circuit 120. FIG. 3 is an enlarged view of a portion indicated by symbol A in FIG. 2(B).

As understood from FIG. 2(B) and FIG. 3, the protection transistor 121 has a first N type high-concentration impurity region (drain D) connected to the source line 130 (not shown in FIGS. 2(B) and 3), a second N type high-concentration impurity region (source S) connected to the ground line 140 (not shown in FIGS. 2(B) and 3), and a gate electrode G. The gate electrode G includes a first gate electrode 122c having a first gate length L1 and a second gate electrode 123c having a second gate length L2 (L1<L2) both of which are formed integrally with each other.

A large number of transistor structural portions are formed integrally at the protection transistor 121. In the present embodiment, first and second transistor structural portions are formed alternately. The first transistor structural portion 122 includes an N type source region 122a (part of second N type high-concentration impurity region S), an N type drain region 122b (part of first N type high-concentration impurity region D) and a gate electrode 122c. The second transistor structural portion 123 includes an N type source region 123a (part of second N type high-concentration impurity region S), an N type drain region 123b (part of first N type high-concentration impurity region D) and a gate electrode 123c. The sum $W_1$ of gate widths $w_1, w_1, \ldots$ of the transistor structural portions 122 is set so as to be smaller than the sum $W_2$ of gate widths $w_2, w_2, \ldots$ of the transistor structural portions 123. The drain regions 122b and 123b are connected to the power line 130 through contacts 124. The source regions 122a and 123a and the gate electrodes 122c and 123c are respectively connected to the ground line 140 through contacts 125. Incidentally, there is no need to set the gate widths of the respective transistor structural portions 122 identical to one another. Further, it is not necessary that the gate widths of the transistor structural portions 123 are also identical to one another.

The operations of the semiconductor device 100 according to the present embodiment will next be explained.

When an electrostatic surge of positive polarity is applied to the source line 130 (refer to FIG. 1), a stray current flows through the internal circuit 110 due to a rise in the potential of the source line 130. When the potential of the source line 130 exceeds a breakdown voltage, a breakdown occurs, so that each of the NMOS transistors lying in the internal circuit 110 is transitioned to a bipolar operation. Since, however, the NMOS transistors in the internal circuit 110 are respectively connected in series to the PMOS transistors (refer to FIG. 2(A)), the surge current is difficult to flow.

Here, the gate length of each transistor structural portion 122 provided in the protection transistor (NMOS transistor) 121 is identical to the gate length L1 of each NMOS transistor provided in the internal circuit 110. Thus, when the breakdown occurs in the internal circuit 110, the transistor structural portion 122 also breaks down. With a rise in the substrate potential B due to the breakdown, the transistor structural portion 122 is also transitioned to the bipolar operation. Further, since the substrate potential B rises, the transistor structural portion 123 formed integrally with the transistor structural portion 122 is also transitioned to the bipolar operation. Thus, the surge current flows in the protection transistor 121 and is absorbed into the ground line 140.

Since the surge current is hard to flow into the internal circuit as described above, most of the surge current flows through the protection transistor 121. Thus, the internal circuit 110 is protected from ESD damage.

The characteristic of the semiconductor device according to the present embodiment will subsequently be explained using FIG. 4.

Figure 4:
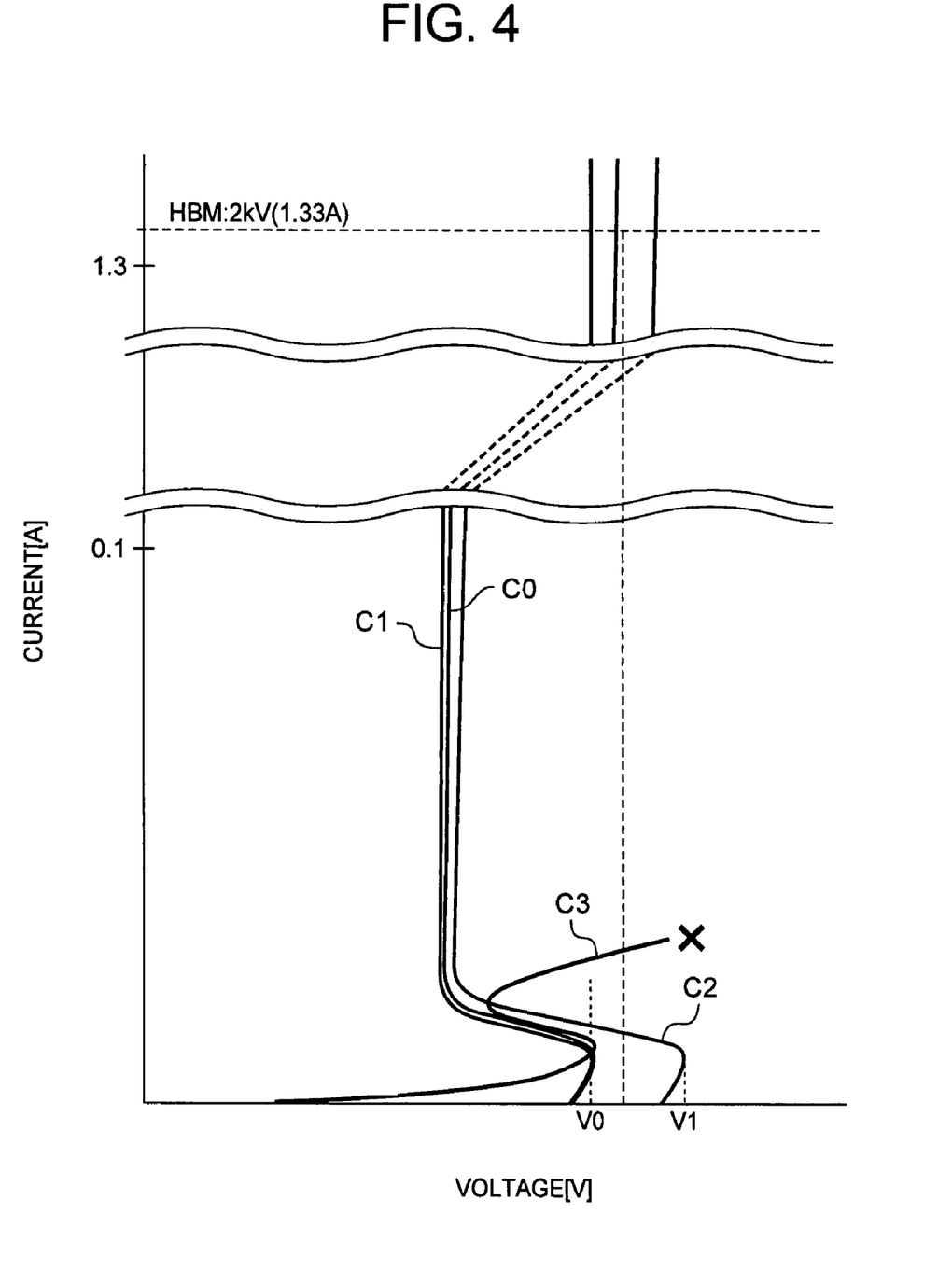
FIG. 4 is a imaginable graph illustrating a current-voltage characteristic of the semiconductor device according to the first embodiment.

FIG. 4 is a imaginable graph for describing current-voltage characteristics of semiconductor devices. The vertical axis indicates a drain current [ampere], and the horizontal axis indicates a source-to-drain voltage [volt]. In FIG. 4, a curve C0 indicates the current-voltage characteristic of the semiconductor device 100 (refer to FIGS. 1 through 3), a curve C1 indicates the current-voltage characteristic of a prior art semiconductor device (gate length L1), and a curve C2 indicates the current-voltage characteristic of a prior art semiconductor device (gate length L2), respectively.

As described above, the gate length of each transistor constituting the internal circuit 110 is L1. Therefore, the protection transistor having only the gate length L1 is turned on at the same source-to-drain voltage V0 as the internal circuit 110. As is understood from FIG. 4, the semiconductor device 100 according to the present embodiment is also turned on at the same source-to-drain voltage V0 as the protection transistor with the gate length L1 alone. Thus, the semiconductor device 100 according to the present embodiment has an excellent ESD damage prevention effect because the protection transistor 121 is turned on with the same timing as the internal circuit 110. Since the protection transistor having only the gate length L2 is turned on at a voltage V1 (V0<V1) in contrast to this, it becomes later than the internal circuit 110 in turn-on timing, so that a sufficient ESD damage prevention effect cannot be obtained.

On the other hand, since the protection transistor 121 according to the present embodiment has the transistor structural portions 123 each having the gate length L2 (L1<L2), a leak current at its non-operation can be reduced as compared with the protection transistor having the gate length L1.

Here, in order to reduce the leak current, the sum $W_1$ of the gate widths $w_1, w_1, \ldots$ of the transistor structural portions 122 may preferably be set as smaller than the sum $W_2$ of the gate widths $w_2, w_2, \ldots$ of the transistor structural portions 123 as possible as described above. Since, however, the turn-on timing of protection transistor 121 becomes later than that of internal circuit 110 as the gate width of the protection transistor 122 is made short, the ESD damage prevention effect is reduced. Thus, the ratio between the gate widths of the transistor structural portions 122 and 123 should suitably be designed depending upon the tradeoff between the leak current reduction effect and the ESD damage prevention effect.

According to the present embodiment as described above, the protection transistor 121 is used in which the transistor structural portions 122 each identical in gate length to the internal circuit 110, and the transistor structural portions 123 each longer than the internal circuit 110 in gate length are formed integrally. It is therefore possible to provide a semiconductor device that is excellent in responsivity to the electrostatic surge (thus hard to cause the electrostatic breakdown) and small in leak current.

Second Preferred Embodiment

A semiconductor device according to a second embodiment of the present invention will next be explained using FIGS. 5 and 6.

Figure 5:
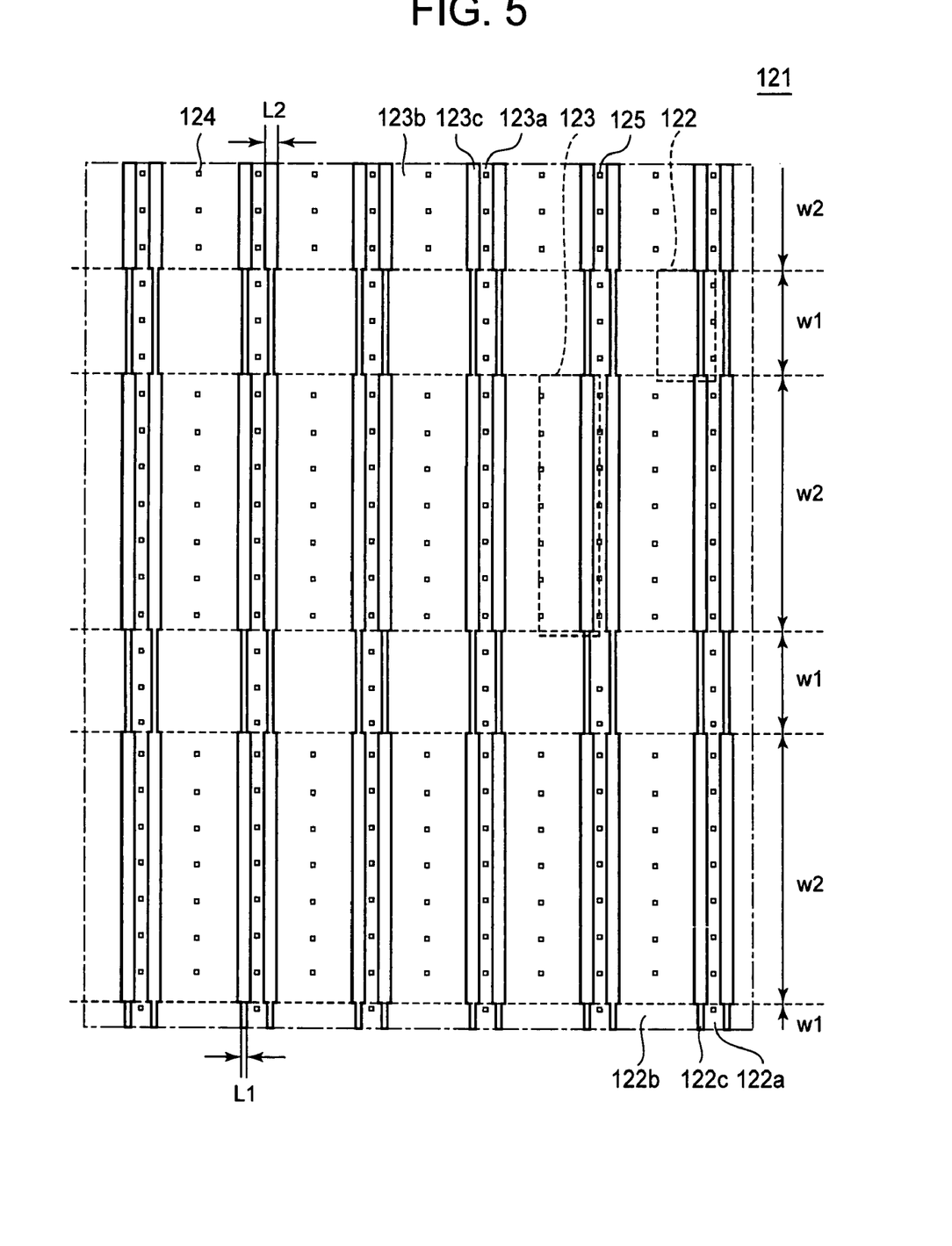
FIG. 5 is a plan view conceptually showing a layout structure of a semiconductor device according to a second embodiment.
Figure 6:
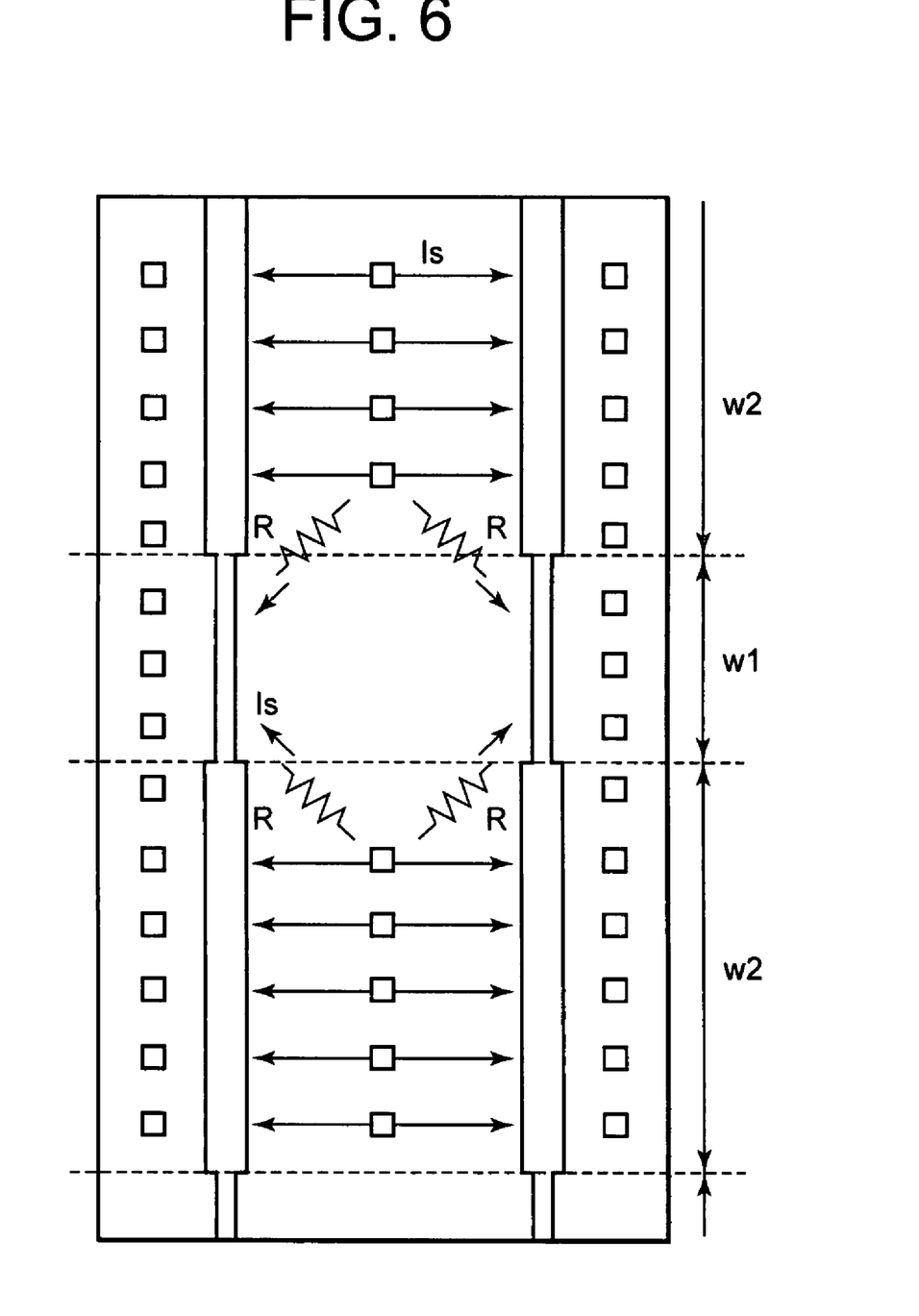
FIG. 6 is a plan view showing, in enlarged form, the layout structure of the semiconductor device according to the second embodiment.

FIG. 5 is a partly enlarged view showing a layout structure of a protection transistor according to the present embodiment. In FIG. 5, constituent elements marked with the same reference numerals as those in FIG. 3 respectively indicate the same ones as those in FIG. 3.

As shown in FIG. 5, the present embodiment is different from the first embodiment in that no contacts 124 are provided in a drain region 122b of each transistor structural portion 122, that is, the contacts 124 that connect the drain of the protection transistor and a source line 130, are provided in each transistor structural portion 123 alone.

Since the semiconductor device according to the present embodiment is similar to the semiconductor device according to the first embodiment (refer to FIGS. 1 and 2) in other configuration portion, its explanations are omitted.

The operation of the semiconductor device according to the present embodiment will next be described using a conceptual plan view of FIG. 6.

When an electrostatic surge of positive polarity is applied to a source line 130 (refer to FIG. 1), a stray current flows through an internal circuit 110 due to a rise in the potential of the source line 130. When the potential of the source line 130 exceeds a breakdown voltage, a breakdown occurs, so that each of NMOS transistors lying in the internal circuit 110 is transitioned to a bipolar operation. However, a surge current is hard to flow due to the reason similar to the first embodiment.

When the breakdown occurs in the internal circuit 110 in a manner similar to the first embodiment, each transistor structural portion 122 of the protection transistor 121 also breaks down. With a rise in substrate potential B due to the breakdown, the transistor structural portions 122 and 123 are also transitioned to the bipolar operation. Thus, the surge current Is flows through the protection transistor 121 and is absorbed into the ground line 140. Here, contacts 124 are not provided in a drain region 122b of each transistor structural portion 122 in the present embodiment as described above. Therefore, the current supplied from the source line 130 flows into the drain region 122b of each transistor structural portion 122 through a drain region of each transistor structural portion 123. Therefore, a parasitic drain resistor R of the transistor structural portion 122 becomes larger than a parasitic drain resistor of the transistor structural portion 123 by intervention of the drain of the transistor structural portion 123 (refer to FIG. 6). Accordingly, the surge current Is flowing through the protection transistor 121 flows through the transistor structural portion 123 in excess and is reduced at the transistor structural portion 122. Thus, the concentration of the surge current on the transistor structural portion 122 short in gate length is reduced in the present embodiment.

Since the transistor structural portion 122 is short in gate length, the surge current is easy to concentrate. Therefore, a junction breakdown or the like is easy to occur. As a method for suppressing the concentration of the surge current, there is considered a method for setting the gate width of the transistor structural portion 122 as long as possible. When the gate width of the transistor structural portion 122 is made long, a leak current of the protection transistor 121 increases correspondingly. On the other hand, in the present embodiment, the concentration of the surge current is suppressed by avoiding the provision of the contacts 124 in the drain of each transistor structural portion 122. Therefore, there is no need to lengthen the gate width of the transistor structural portion 122. Thus, an increase in leak current is avoided.

According to the present embodiment as described above, a semiconductor device can be provided which is excellent in responsivity to an electrostatic surge and is further smaller in leak current than the first embodiment.

Third Preferred Embodiment

A semiconductor device according to a third embodiment of the present invention will next be explained using FIGS. 7 and 8.

The present embodiment is of an example in which the invention according to the second embodiment is applied to a semiconductor device (i.e., a semiconductor device in which a compound of silicon and a metal is used for a source/drain electrode) of a silicide structure.

Figure 7:
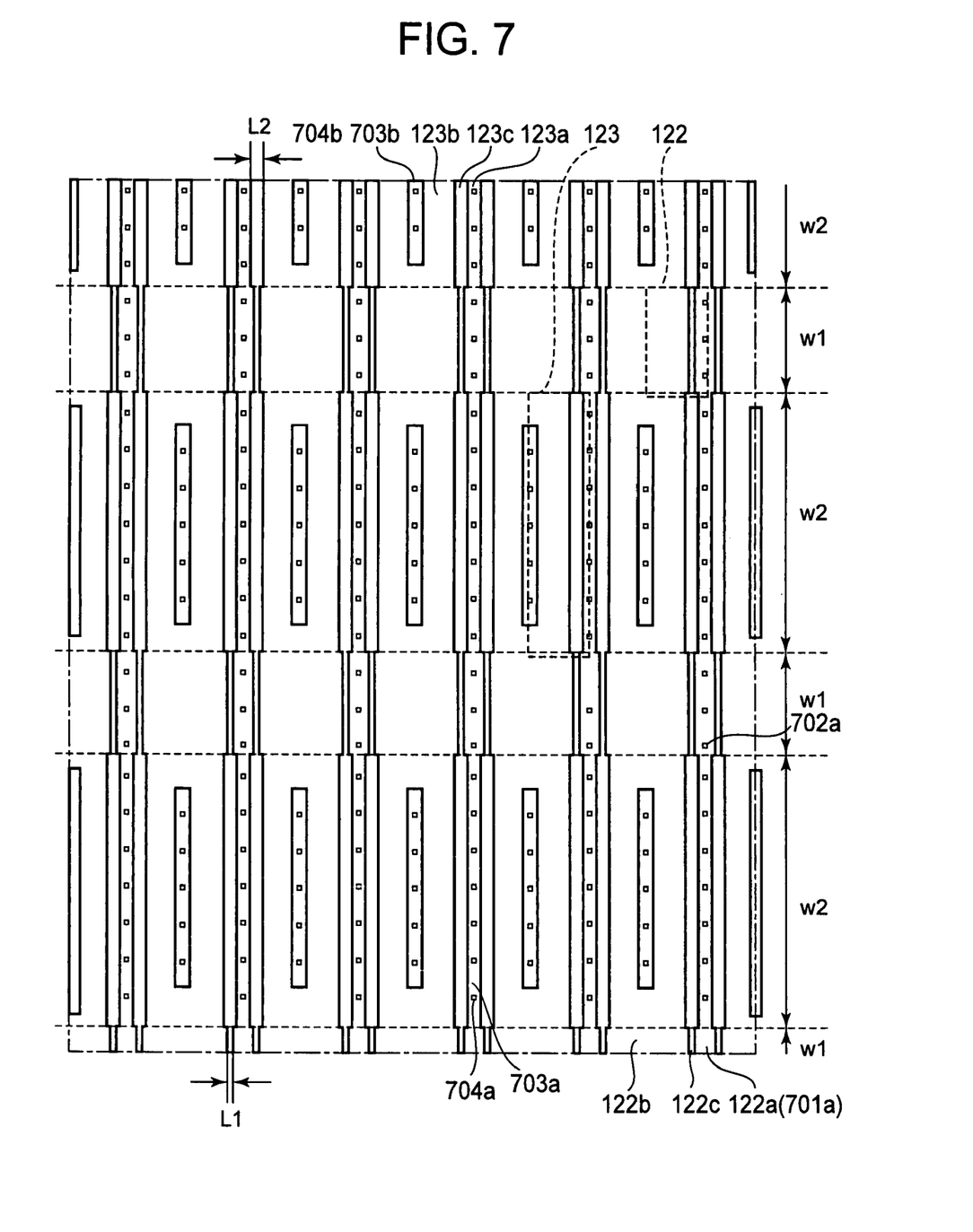
FIG. 7 is a plan view conceptually showing a layout structure of a semiconductor device according to a third embodiment.
Figure 8:
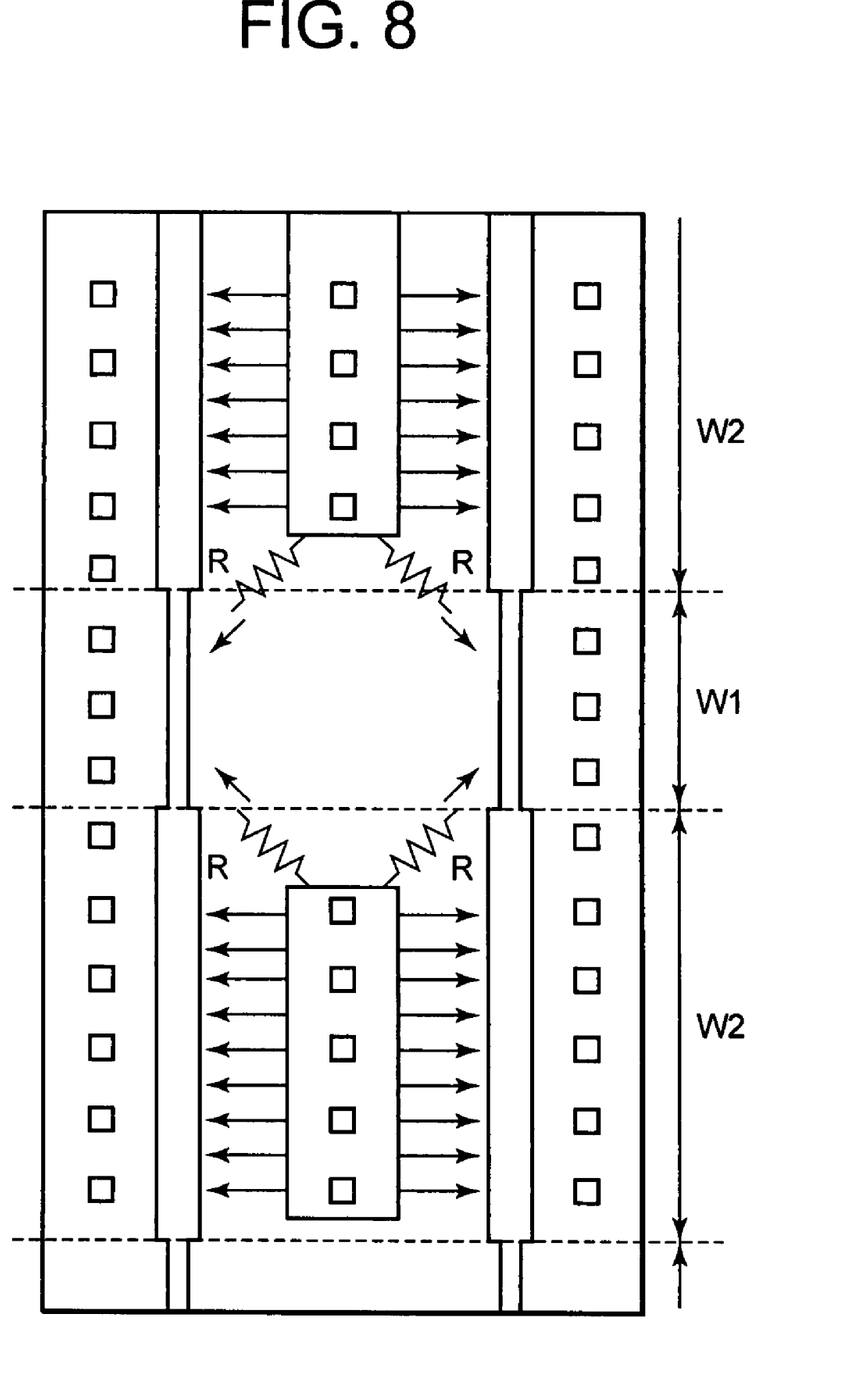
FIG. 8 is a plan view showing, in enlarged form, the layout structure of the semiconductor device according to the third embodiment.

FIG. 7 is a partly enlarged view showing a layout structure of a protection transistor according to the present embodiment. In FIG. 7, constituent elements marked with the same reference numerals as those in FIG. 5 respectively indicate the same ones as those shown in FIG. 5.

In FIG. 7, a silicide layer 701a and contacts 702a are formed in the surface of a source region 122a of each transistor structural portion 122. The source region 122a and a ground line 140 (not shown in FIG. 7) are connected to each other via the contacts 702a. On the other hand, the silicide layer and the contacts are not formed in a drain region 122b of the transistor structural portion 122.

A silicide layer 703a and contacts 704a are formed in the surface of a source region 123a of each transistor structural portion 123. The source region 123a and the ground line 140 (not shown in FIG. 7) are connected to each other via the contacts 704a. Further, a drain region 123b of the transistor structural portion 123 is connected to a source line 130 (not shown in FIG. 7) via a silicide layer 703b and contacts 704b.

Thus, in the present embodiment, the silicide layer and the contacts are not provided in the drain region 122b of each transistor structural portion 122.

The operation of the semiconductor device according to the present embodiment will next be explained using a conceptual plan view of FIG. 8.

In a manner similar to the first and second embodiments, an electrostatic surge of positive polarity is applied to the source line 130 (refer to FIG. 1). When the potential of the source line 130 exceeds a breakdown voltage, a breakdown is developed, so that each of NMOS transistors lying in an internal circuit 110 is transitioned to a bipolar operation. However, a surge current is hard to flow due to the reasons similar to the first and second embodiments.

When the breakdown occurs in the internal circuit 110 in a manner similar to the first and second embodiments, each transistor structural portion 122 of the protection transistor 121 also breaks down. With a rise in substrate potential due to the breakdown, the transistor structural portions 122 and 123 are also transitioned to the bipolar operation. Thus, the surge current flows through the protection transistor 121 and is absorbed into the ground line 140. Here, the contacts are not provided in the drain region 122b of each transistor structural portion 122 in the present embodiment. Therefore, the current supplied from the source line 130 flows into the drain region of the transistor structural portion 122 through the drain region of the transistor structural portion 123.

The reason why the silicide layer is not formed in the drain region of each transistor structural portion 122 in the present embodiment will be explained below.

The resistance of the silicide layer is low one digit or more as compared with an impurity diffusion region. Therefore, the difference in drain resistance between the transistor structural portions 122 and 123 is not made so large where the silicide layer is provided in the drain region of the transistor structural portion 122. Thus, in the present embodiment, the silicide layer as well as the contacts is not provided in the drain region of the transistor structural portion 122, and the difference in drain resistance between the transistor structural portions 122 and 123 is made large sufficiently. Thus, the present embodiment is capable of sufficiently reducing concentration of the surge current on the transistor structural portion 122.

In the present embodiment, the concentration of the surge current is suppressed by avoiding the provision of the silicide layer and the contacts in the drain of each transistor structural portion 122. Thus, due to the same reason as the second embodiment, there is no need to lengthen the gate width of the transistor structural portion 122, and hence no leak current is increased.

According to the present embodiment as described above, a semiconductor device that is excellent in responsivity to an electrostatic surge and small in leak current, can be provided in a manner similar to the second embodiment.

Fourth Preferred Embodiment

A semiconductor device according to a fourth embodiment of the present invention will next be explained using FIG. 9.

The present embodiment is different from the first embodiment in that the boundary between transistor structural portions 122 and 123 is formed in such a manner that their gate lengths change continuously.

FIG. 9 is a partly enlarged view conceptually showing a layout structure of a protection transistor according to the present embodiment. FIG. 10 is a diagram conceptually illustrating a protection transistor/layout structure for comparison. In FIGS. 9 and 10, constituent elements marked with the same reference numerals as those shown in FIG. 3 respectively indicate the same ones as those shown in FIG. 3.

Figure 9A:
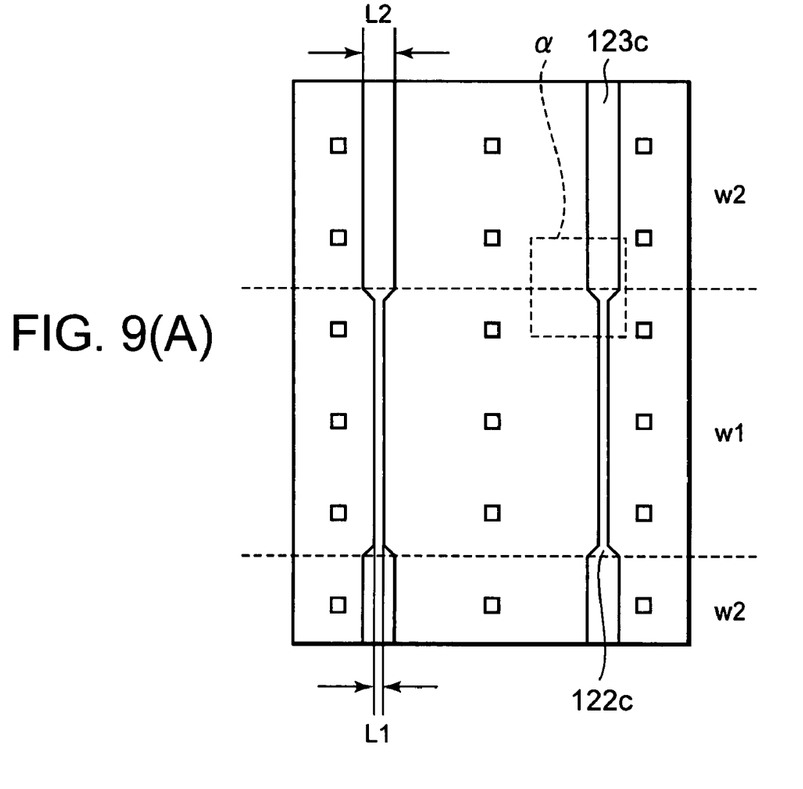
FIG. 9(A) is a plan view showing, in enlarged form, a layout structure of a semiconductor device according to a fourth embodiment.

In the present embodiment, as indicated by symbol α in FIG. 9(A), the gate lengths of gate electrodes 122c and 123c are formed so as to continuously change from L1 to L2 in the neighborhood of the boundary between the transistor structural portions 122 and 123.

Figure 10A:
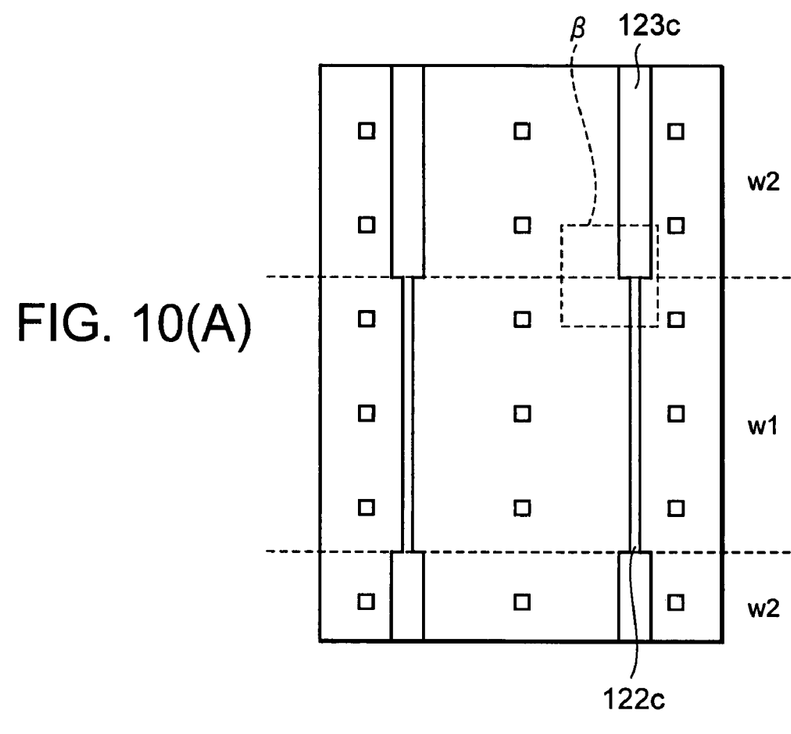
FIG. 10(A) is a plan view depicting, in enlarged form, a layout structure of a semiconductor device according to a comparative example of the fourth embodiment.

On the other hand, in the example of FIG. 10(A), the gate lengths of gate electrodes 122c and 123c are formed so as to change from L1 to L2 in rectangular form on the boundary between transistor structural portions 122 and 123 as indicated by symbol β.

Figure 10B:
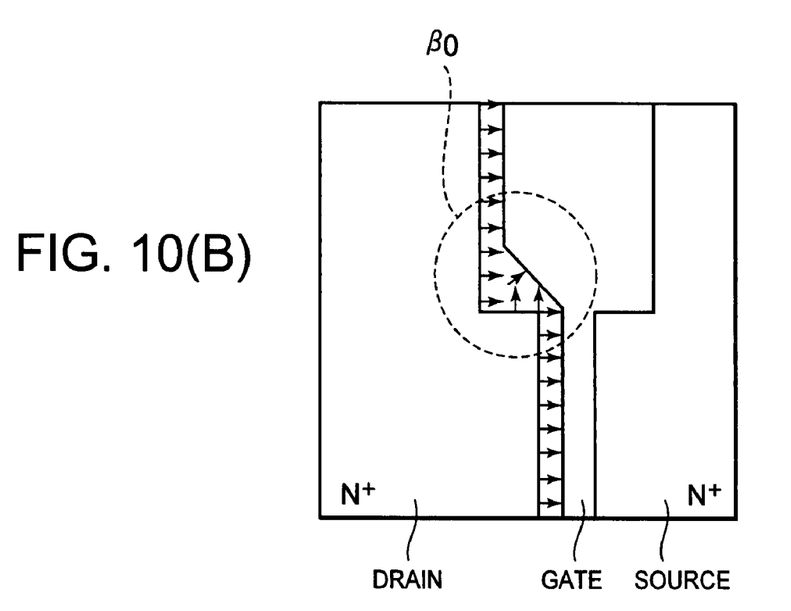
FIG. 10(B) is a conceptual diagram showing the principle of the semiconductor device.

When the gate electrode has a rectangular shape as shown in FIG. 10(B), an electric field is easy to concentrate on its apex-angle portion β0. Therefore, when a surge current flows through the protection transistor 121, the surge current concentrates on the apex-angle portion β0. Thus, a junction breakdown or the like is easy to take place at the apex-angle portion β0.

Figure 9B:
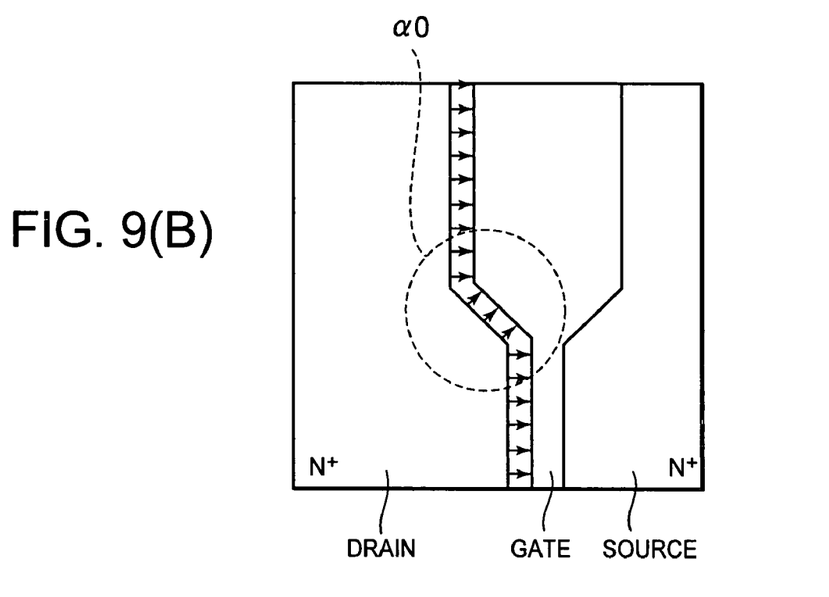
FIG. 9(B) is a conceptual diagram illustrating the principle of the semiconductor device.

On the other hand, in the present embodiment, the electric field is hard to concentrate on the boundary between the transistor structural portions 122 and 123 as indicated by α0 in FIG. 9(B) because the gate lengths gradually change from L1 to L2. In the present embodiment, the surge current is therefore hard to concentrate on the boundary when the surge current flows through the protection transistor 121. Thus, a transistor breakdown such as a junction breakdown is hard to occur.

Since the operation of the semiconductor device according to the present embodiment is similar to the first embodiment, its explanations are omitted.

According to the present embodiment as described above, a semiconductor device that is excellent in responsivity to an electrostatic surge (thus hard to cause an electrostatic breakdown) and small in leak current can be provided due to the reason similar to the first embodiment.

In addition, according to the present embodiment, it is possible to make it hard to generate the transistor breakdown due to the surge current due to the above reason.

Fifth Preferred Embodiment

A semiconductor device according to a fifth embodiment of the present invention will next be described using FIG. 11.

The present embodiment is different from the first embodiment in that protrusions or convex portions are provided only on the source region side of both ends of a gate electrode to set the gate lengths of transistor structural portions 122 and 123.

FIG. 11 is a partly enlarged view conceptually showing a layout structure of a protection transistor according to the present embodiment. In FIG. 11, constituent elements marked with the same reference numerals as those shown in FIG. 3 respectively indicate the same ones as those shown in FIG. 3.

Figure 11A:
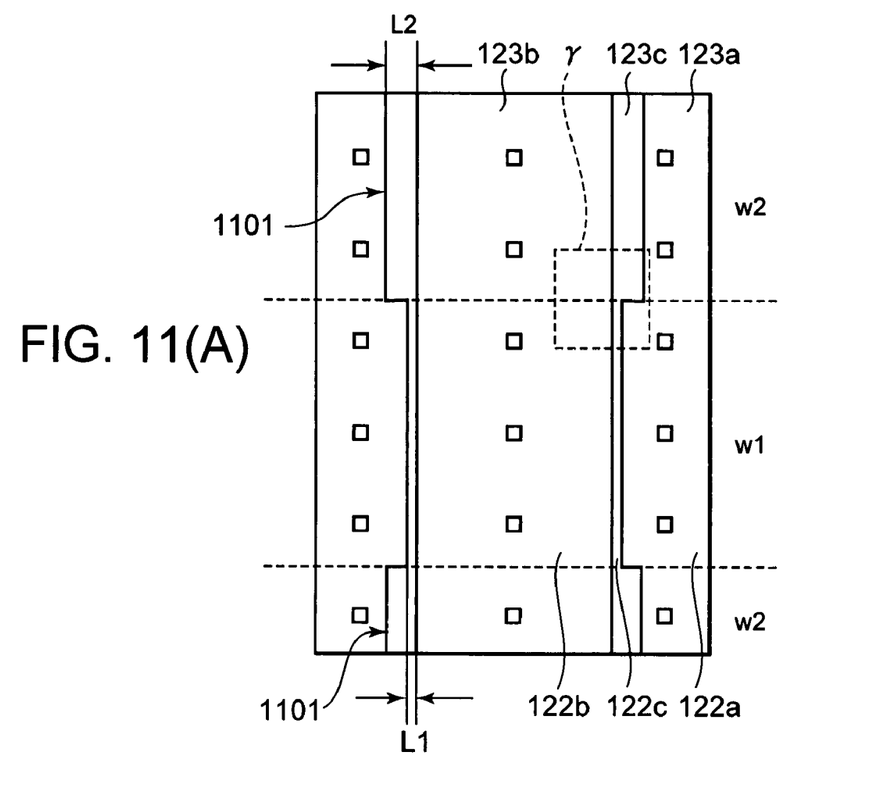
FIG. 11(A) is a plan view showing, in enlarged form, a layout structure of a semiconductor device according to a fifth embodiment.
Figure 11B:
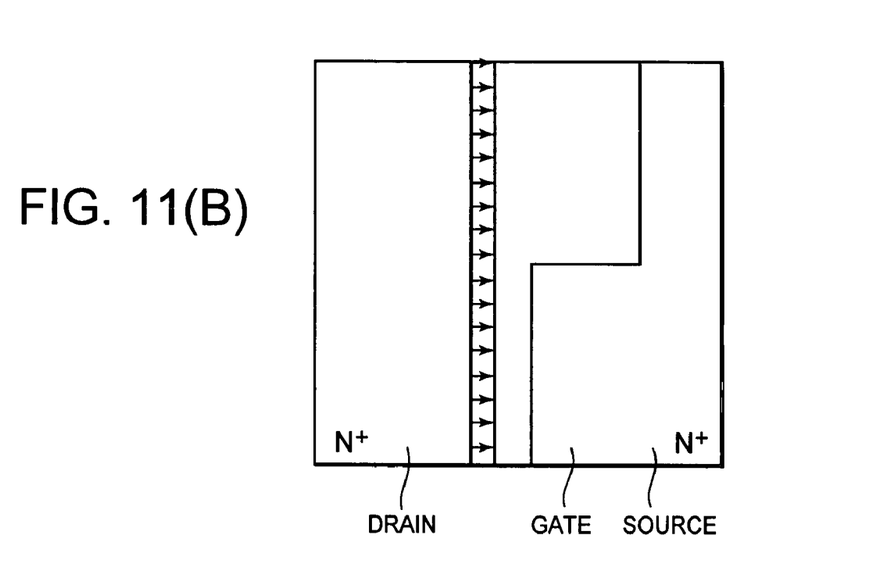
FIG. 11(B) is a conceptual diagram showing the principle of the semiconductor device.

In the present embodiment, as indicated by symbol γ in FIG. 11(A), projections or convex portions 1101 are provided only on the source region side of both ends of the gate electrode. Thus, the gate length of each transistor structural portion 122 is set to L1 and the gate length of each transistor structural portion 123 is set to L2.

When each of the gate electrodes 122c and 123c has a rectangular shape, the concentration of a surge current takes place on the drain regions 122b and 123b sides. On the other hand, in the present embodiment, the end faces of the gate electrodes 122c and 123c are formed linearly on the sides of the drain region 122b and 123b and hence electric field concentration is not generated (refer to FIG. 11(B)). Thus, even though the surge current flows through the protection transistor 121, the surge current is hard to concentrate on the boundary between the transistor structural portions 122 and 123. Hence, a transistor breakdown such as a junction breakdown is hard to occur.

Since the operation of the semiconductor device according to the present embodiment is similar to the first embodiment, its description is omitted.

According to the present embodiment as described above, a semiconductor device that is excellent in responsivity to an electrostatic surge (thus hard to cause an electrostatic breakdown) and small in leak current can be provided due to the reason similar to the first embodiment.

In addition, according to the present embodiment, it is possible to make it hard to develop the transistor breakdown due to the surge current due to the above reason.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device comprising:
an internal circuit connected to first and second source lines; and
a protection circuit connected to the first and second source lines to protect the internal circuit,
wherein the protection circuit has a protection transistor which includes first high-concentration impurity regions each connected to the first source line, second high-concentration impurity regions each connected to the second source line, and control electrodes which have first control electrodes each having a first gate length and second control electrodes each having a second gate length longer than the first gate length, the first and second control electrodes are connected to each other and to the second source line,
wherein the protection transistor includes first transistor structural portions each having the first high-concentration impurity regions, the second high-concentration impurity regions and the first control electrodes, and second transistor structural portions each having the first high-concentration impurity regions, the second high-concentration impurity regions and the second control electrodes, and
wherein contacts for connecting the first high-concentration impurity regions to the first source line are provided in the second transistor structural portions respectively and not in the first transistor structural portions.

2. The semiconductor device according to claim 1, wherein the first gate length of the first control electrodes is identical to a gate length of each of transistors that constitute the internal circuit.

3. The semiconductor device according to claim 1, wherein a sum of the first gate widths of the first control electrodes is smaller than a sum of the second gate widths of the second control electrodes.

4. The semiconductor device according to claim 1, wherein in a boundary region between the first and second transistor structural portions, gate length of the control electrodes changes gradually from the first gate length to the second gate length.

5. The semiconductor device according to claim 1, wherein convex portions are provided only on the second high-concentration impurity region side with respect to the control electrodes of the protection transistor.

6. A semiconductor device comprising:
an internal circuit connected to first and second source lines: and a protection circuit connected to the first and second source tines to protect the internal circuit, wherein the protection circuit has a protection transistor which includes first high-concentration impurity regions each connected to the first source line, second high-concentration impurity regions each connected to the second source line, and control electrodes which have first control electrodes each having a first gate length and second control electrodes each having a second gate length longer than the first gate length, the first and second control electrodes are connected to each other and to the second source line, wherein the protection transistor includes first transistor structural portions each having the first high-concentration impurity regions, the second high-concentration impurity regions and the first control electrodes, and second transistor structural portions each having the first high-concentration impurity regions, the second high-concentration impurity regions and the second control electrodes, wherein silicide electrodes and contacts for connecting the first high-concentration impurity regions to the first source line are provided in the second transistor structural portions respectively and not in the first transistor structural portions, and wherein suicide electrodes and contacts for connecting the second high-concentration impurity regions to the second source line are provided in both the first and second transistor structural portions.

7. The semiconductor device according to claim 6, wherein the first gate length of the first control electrodes is identical to a gate length of each of transistors that constitute the internal circuit.

8. The semiconductor device according to claim 6, wherein a sum of the first gate widths of the first control electrodes is smaller than a sum of the second gate widths of the second control electrodes.

9. The semiconductor device according to claim 6, wherein in a boundary region between the first and second transistor structural portions, gate length of the control electrodes changes gradually from the first gate length to the second gate length.

10. The semiconductor device according to claim 6, wherein convex portions are provided only on the second high-concentration impurity region side with respect to the control electrodes of the protection transistor.

* * * * *